United States Patent
Priller et al.

(10) Patent No.: US 10,193,572 B2
(45) Date of Patent: Jan. 29, 2019

(54) METHOD FOR RECONSTRUCTING A DATA PACKET INCORRECTLY RECEIVED IN A WIRELESS SENSOR NETWORK

(71) Applicant: AVL LIST GMBH, Graz (AT)

(72) Inventors: Peter Priller, Gratwein-Strassengel (AT); Alexander Entinger, Linz (AT); Achim Berger, Waidhofen/Ybbs (AT)

(73) Assignee: AVL LIST GMBH, Graz (AT)

( * ) Notice: Subject to any disclaimer, the term of this patent is extended or adjusted under 35 U.S.C. 154(b) by 0 days.

(21) Appl. No.: 15/521,495

(22) PCT Filed: Oct. 23, 2015

(86) PCT No.: PCT/EP2015/074616
§ 371 (c)(1),
(2) Date: Apr. 24, 2017

(87) PCT Pub. No.: WO2016/062865
PCT Pub. Date: Apr. 28, 2016

(65) Prior Publication Data
US 2017/0338835 A1    Nov. 23, 2017

(30) Foreign Application Priority Data
Oct. 23, 2014   (AT) .............................. A 50762/2014

(51) Int. Cl.
*H03M 13/11* (2006.01)
*H03M 13/15* (2006.01)
*H04L 1/00* (2006.01)

(52) U.S. Cl.
CPC ............ *H03M 13/15* (2013.01); *H04L 1/004* (2013.01); *H04L 1/0057* (2013.01)

(58) Field of Classification Search
CPC ..................................................... H03M 13/11
(Continued)

(56) References Cited

U.S. PATENT DOCUMENTS

| 3,668,631 | A  | 6/1972  | Griffith et al. |
| 6,314,433 | B1 | 11/2001 | Mills et al.    |

(Continued)

FOREIGN PATENT DOCUMENTS

| EP | 2779506 | 9/2014 |
| WO | 0207374 | 1/2002 |

OTHER PUBLICATIONS

E. Uhlemann et al., "Hard Decision Packet Combining Methods for Industrial Wireless Relay Networks," Communication and Electronics, 2008, ICCE 2008, Second International Conference on Communication and Electronics, Jun. 4-6, 2008, pp. 104-108.

*Primary Examiner* — Fritz Alphonse
(74) *Attorney, Agent, or Firm* — Whitmyer IP Group LLC

(57) ABSTRACT

In order to manage with a smaller number of retransmissions of a data packet during attempts to reconstruct a data packet that has been incorrectly received in a wireless sensor network, it is proposed to implement in the receiving unit (2) a first method and a second method for reconstructing the incorrectly received data packet (DP), in a first step to apply the first method for reconstructing the incorrectly received data packet (DP) and to check for whether the data packet (DP) has thus been reconstructed, and in a subsequent second step to apply the second method for reconstructing the incorrectly received data packet (DP) if the incorrectly received data packet (DP) has not been reconstructed with the first method, and to check for whether the data packet (DP) has thus been reconstructed.

18 Claims, 7 Drawing Sheets

Figure 1:
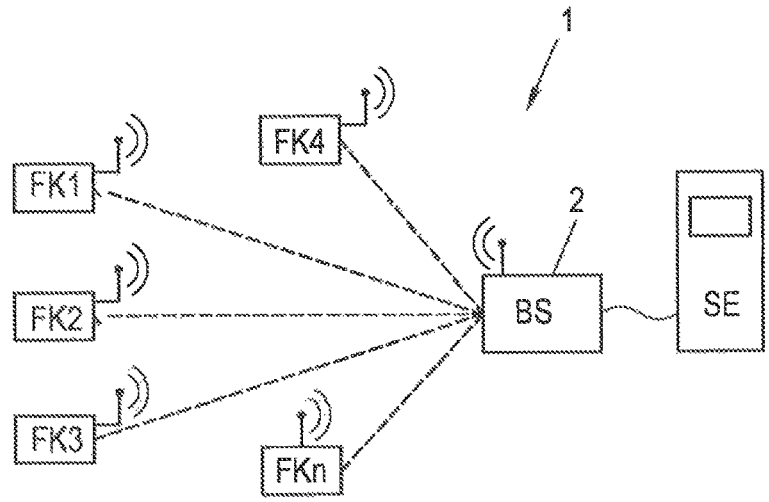

(58) Field of Classification Search
USPC ........................................ 714/758, 761, 762
See application file for complete search history.

(56) References Cited

U.S. PATENT DOCUMENTS

| | | |
|---|---|---|
| 6,876,705 B2 | 4/2005 | Katsavounidis et al. |
| 7,640,480 B2 | 12/2009 | Barthel et al. |
| 8,327,232 B2 | 12/2012 | Budampati et al. |
| 2003/0053435 A1 | 3/2003 | Sindhushayana |
| 2011/0149075 A1 | 6/2011 | Bäse et al. |
| 2013/0322959 A1* | 12/2013 | Robl ........................ F16D 1/00 403/326 |
| 2014/0198776 A1* | 7/2014 | Nammi ................ H04B 7/0486 370/336 |
| 2014/0281829 A1 | 9/2014 | Sutterlin |
| 2017/0338835 A1* | 11/2017 | Priller ................... H04L 1/0057 |

\* cited by examiner

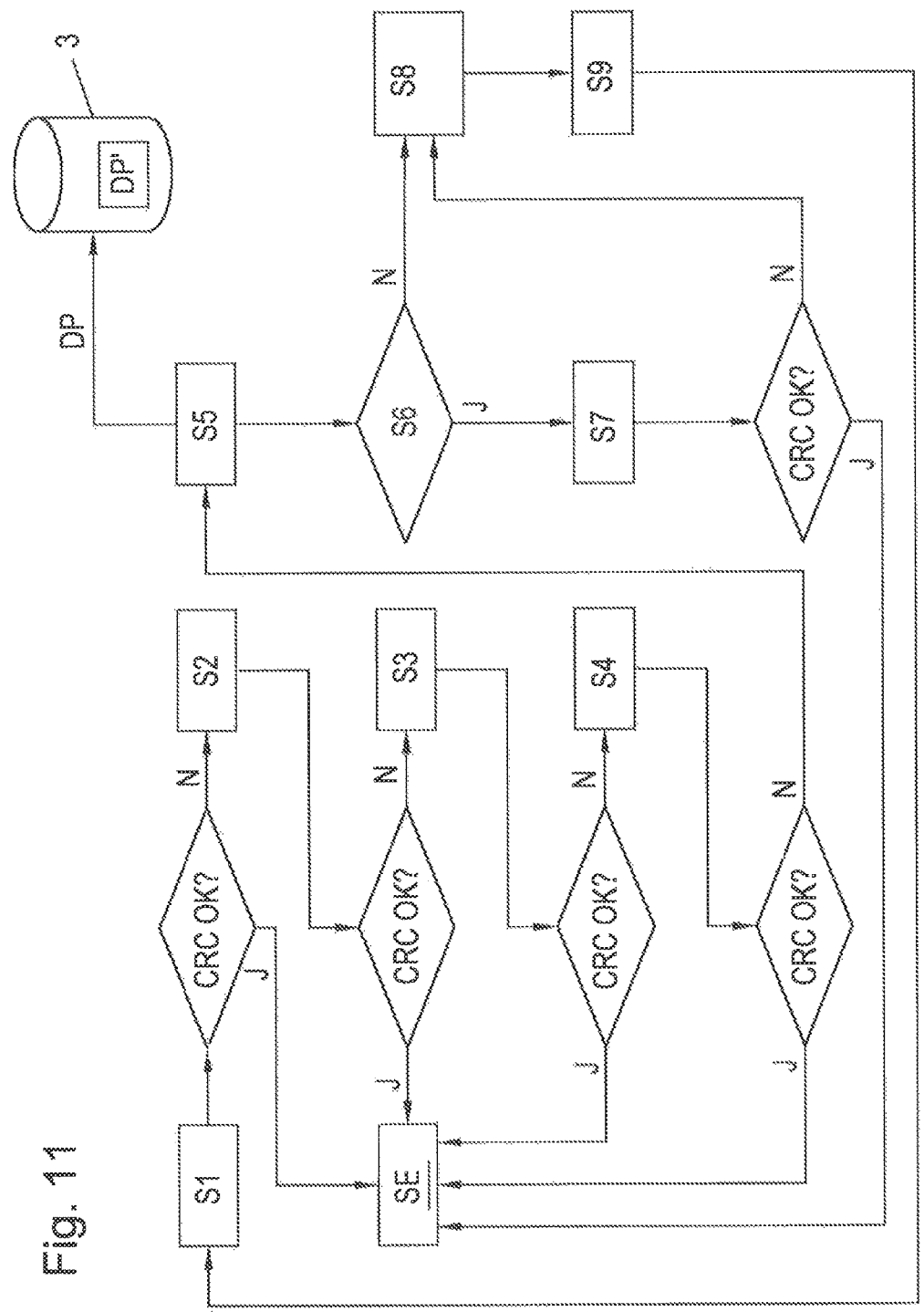

METHOD FOR RECONSTRUCTING A DATA PACKET INCORRECTLY RECEIVED IN A WIRELESS SENSOR NETWORK

The present invention relates to a method for reconstructing an incorrectly received data packet that has been transmitted in a wireless sensor network from a wireless node to a receiving unit.

For controlling, regulating, and monitoring of machines such as production machines, motor vehicles, handling machines (robots), etc., or facilities such as manufacturing facilities, production facilities, test stands for vehicles or vehicle parts, etc., numerous sensors are used which detect a large variety of measured variables and transmit the detected measured values of the measured variables to associated control units. Such machines and facilities likewise include numerous actuators for controlling the machine or facility under the control of the control unit. For example, a modern vehicle includes various control units, such as an engine control unit (ECU), a transmission control unit (TCU), a hybrid control unit (HCU), a braking control unit (BCU), etc., which receive and process all the various measured values from various sensors installed on the vehicle. Based on these measured values, actuators that are likewise installed are used to make various interventions in the vehicle or in vehicle components, for example adjustment of the air-fuel ratio based on the instantaneous content of CO, $CO_2$, or $NO_x$ in the exhaust gas. The totality of the installed sensors and actuators, or a portion thereof, is referred to as a sensor network.

However, the plurality of sensors and actuators must be connected to the control unit(s), which requires wiring. Frequently, field buses are used, via which I/O units and a control unit are connected to one another via a data bus, for example CAN, LIN, FlexRay, Ethernet, etc. The sensors and actuators are wired to an I/O unit, which as a bus user is connected to the data bus. In addition, there are also hard-wired systems in which a sensor is hard-wired to an associated control unit via a dedicated cable. This requires an enormous wiring effort with high costs, high error potential, high installation effort, high maintenance effort, and great weight.

In a departure from such wired sensor networks, wireless sensor networks are also being increasingly used, in which a wireless sensor/actuator, referred to below as a wireless node, exchanges data with an associated control unit via a wireless data link. As a result, the wiring effort required heretofore is at least partially dispensed with. Such wireless sensor networks include a plurality of wireless nodes that communicate with an associated base station. Of course, multiple base stations to which multiple wireless nodes are respectively connected may also be provided.

However, numerous problems arise even in wireless sensor networks. The industrial environment of the wireless sensor network is often harsh, with many possible interferences (for example, electromagnetic interference sources, signal shading, signal reflections, etc.) for the wireless data communication. In addition, the wireless sensor network must often also share the transmission channel (in particular a certain frequency range) with other wireless communication systems, such as a WLAN or Bluetooth, which may likewise result in interferences. Last but not least, supplying power to the wireless sensors/actuators is a major problem, since an adequate service life of the wireless nodes is necessary for industrial use. In particular, however, the wireless data transmission requires large quantities of electrical energy, so that the battery life of the wireless nodes may be problematic. In addition, a sufficiently low data transmission error rate and a sufficiently high data transmission rate must be achievable in the data transmission to be able to use a wireless sensor network in the industrial environment at all.

In principle, in digital data transmission technology there are known error recognition and error correction mechanisms that could also be used in wireless sensor networks. Prior to the transmission, these mechanisms encode available information which is then transmitted in the form of data, as the result of which the information is no longer directly present during the transmission and upon receipt, and instead must first be decoded at the receiver. However, such error recognition and error correction mechanisms include quite complex computations, which in the case of a wireless sensor network must be carried out in the transmitting wireless nodes, which is energy-intensive. In addition, on the receiver side this naturally increases the computing time, since the encoded data must first be decoded according to the error recognition and error correction mechanisms. Such methods are therefore hardly suitable for wireless sensor networks in the industrial environment.

For this reason, wireless sensor networks have been the subject of much research and development activity in recent years in order to address the associated problems.

To reduce the data transmission error rate, strategies focused on the requirements in wireless sensor networks have already been developed for checking and correcting received data. For example, in E. Uhlemann, et al., "Hard decision packet combining methods for industrial wireless relay networks," Communications and Electronics, 2008, ICCE 2008, Second International Conference on Communication and Electronics, Jun. 4-6, 2008, pp. 104-108, it is described how received data may be corrected in the receiver based on a cyclic redundancy code (CRC). For this purpose, an incorrectly received data packet that is identified based on the CRC is not discarded, but, rather, is stored in a buffer. The incorrectly received data packet is retransmitted by the sender. If the CRC check once again shows an incorrect data transmission, the previously buffered message and the newly received message are analyzed bit by bit, and an attempt is made to reconstruct therefrom the correct data by reiterating the bits in the positions in which the two data packets differ, and in each case checking the CRC. This method is known as combinatorial testing. If the data packet cannot be reconstructed, an additional retransmission of the data packet may be requested. This results in a reduction of the data transmission error rate and the number of necessary data transmissions. A similar procedure may also be found in U.S. Pat. No. 8,327,232 B2.

The drawback of this method is that it is always necessary to retransmit the incorrectly received data packet, which, however, is undesirable in light of the limited available electrical energy in the transmitting wireless node, since the battery life is thus reduced.

The object of the present invention is to provide a method for reconstructing an incorrectly received data packet in a receiving unit of a wireless sensor network, which manages with a smaller number of retransmissions of the data packet.

This object is achieved by a method in which a first method and a second method for reconstructing an incorrectly received data packet are implemented in the receiving unit; in a first step, the first method for reconstructing the incorrectly received data packet is applied and a check is made for whether the data packet has thus been reconstructed, and in a subsequent second step, the second method for reconstructing the incorrectly received data packet is applied if the incorrectly received data packet has not been reconstructed with the first method, and a check is made for whether the data packet has thus been reconstructed.

In a variant of the invention, a first method and a second method for reconstructing an incorrectly received data packet are implemented in the receiving unit, using the content, known in advance, of various data fields and/or information that is derivable from certain bits of the data packet. Use is thus made of the fact that data fields of sent data packets have content (information) that is known in advance. Information that is derived from the information that is known in advance is also considered to be known information.

As the result of implementing various methods for the reconstruction, various complex methods may be applied which require different levels of computation effort and which promise different probabilities of success. This allows a simple first method to be applied to the incorrectly received data packet in a first step, which preferably requires little computation effort. If the first method is successful, i.e., if the data packet may thus be successfully reconstructed, it is not necessary to apply a second method, or even to request a retransmission of the data packet. With the second method, a new attempt at reconstruction may be undertaken on the incorrectly received data packet, likewise without requiring a retransmission of the data packet. In this regard, methods are preferred which make it possible to manage with little computation effort. The motivation for this is that, due to the data transmission protocol that is implemented, only a limited time period is available until a retransmission of the data packet must be requested in the event of a faulty transmission. Thus, only this limited time period is available for undertaking reconstruction attempts. Therefore, it is practical to begin with a method that requires less computation effort, since the probability is then high that sufficient time still remains for carrying out a second method. The subsequent application of various methods for reconstructing an incorrectly received data packet increases the overall probability that an incorrectly received data packet is reconstructed, without this requiring a retransmission.

The data packets transmitted from the wireless node are made up of data fields with data that directly contain information (i.e., data that are uncoded, without encoding by error recognition and error correction mechanisms). That is, the information is directly contained as data in the data fields without applying customary error recognition and error correction mechanisms. This is in contrast to information that is encoded within the scope of a forward error correction, using known error recognition and error correction mechanisms. In the latter case, during the transmission and reception the data fields would contain only data that must be decoded at the receiver in order to obtain the information. This also avoids the need to use very powerful hardware, such as a large amount of RAM, a fast processor, a high-grade parallel computer (multicore), etc., in the receiving unit. This hardware would otherwise be necessary for decoding the information. Although this would of course allow very complex methods to be applied for the reconstruction, it would not be possible to use available standard hardware as a receiving unit. In contrast, the invention allows the highest possible success of repairs with the lowest possible hardware outlay.

Reconstruction of incorrectly received data packets may thus take place without retransmission, at least with few retransmissions, without being dependent on complicated error recognition and error correction mechanisms which have previously been customary.

The method may advantageously be expanded by applying, in at least one further subsequent step, a further method, implemented in the receiving unit, for reconstructing the incorrectly received data packet if the incorrectly received data packet has not been reconstructed with the second method, and checking whether the data packet has thus been reconstructed. The application of further reconstruction methods further increases the probability that an incorrectly received data packet is reconstructed, without the need for a retransmission.

A particularly simple first method that may be carried out with little computation effort results when the value of at least one bit of a data field of the data packet is known, and in the incorrectly received data packet this at least one bit is modified, and a check is made for whether the data packet has been reconstructed due to this modification. A priori knowledge of the structure of the data packet may be utilized to rapidly examine certain bits of the data packet for possible errors.

In an advantageous second method, knowledge concerning the data packet that is derivable a posteriori is used, the expected value of at least one bit of a data field being derived from the incorrectly received data packet, and this at least one bit in the incorrectly received data packet being modified, and a check being made for whether the data packet has been reconstructed due to this modification. In this method, other information is thus derived from the known information contained in the data, and therefore is also known information.

The computation effort here is slightly greater than in the first method, since the data packet must first be examined, but this may still be carried out quickly enough on standard hardware.

To even further increase the probability of repair, a further method for reconstructing an incorrectly received data packet may be implemented, which is optionally carried out after the second method if the two preceding methods have remained unsuccessful. In one advantageous further method, an error block having a length of bits is shifted step by step over at least a portion of the incorrectly received data packet, and in each step all bits present in the error block are inverted, and in each step a check is made for whether the data packet has been reconstructed due to this modification. In one possible adaptation of the further method, in each step the bits present in the error block may be reiterated, and in each case a check may be made for whether the data packet has been reconstructed due to this modification, which further increases the probability of the reconstruction.

If it is not possible to reconstruct the data packet without retransmission, it may be provided to apply further methods based on the retransmission of the data packet. In one possible method, at least two incorrectly received data packets are compared to one another, and bit positions are identified at which the two data packets differ, and the bits are reiterated step by step at at least one of these bit positions, and in each step a check is made for whether the data packet has been reconstructed due to this modification. It may also be provided to define a bit range around the bit position, with a number of bits before the bit position and/or a number of bits after the bit position, and to reiterate the bits in the bit range step by step.

Figure 3:
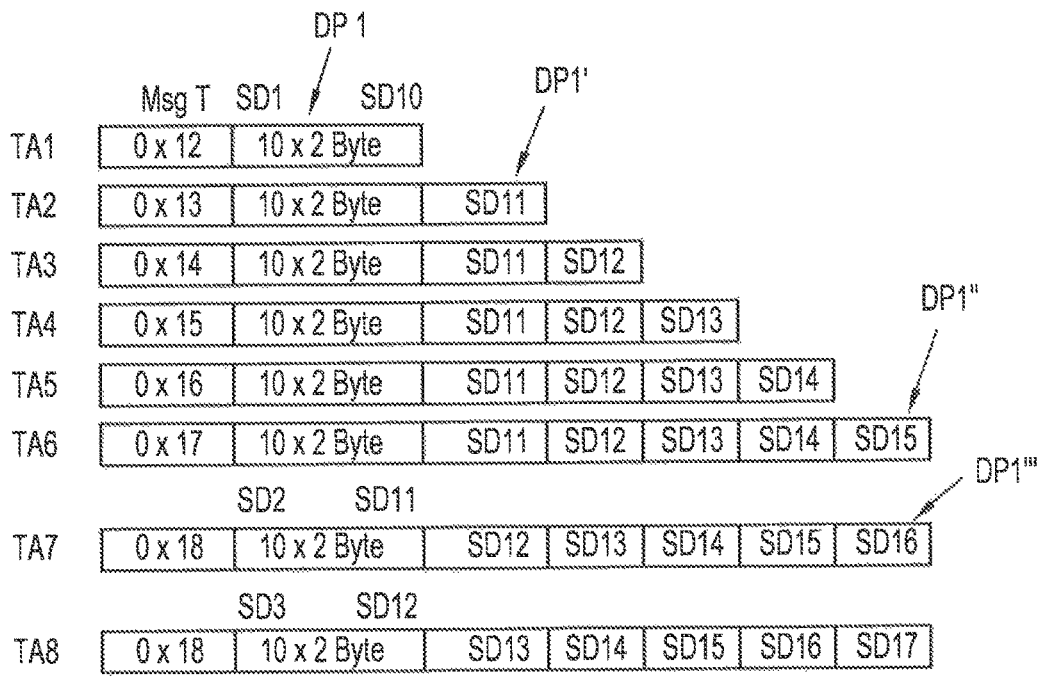
Figure 2:
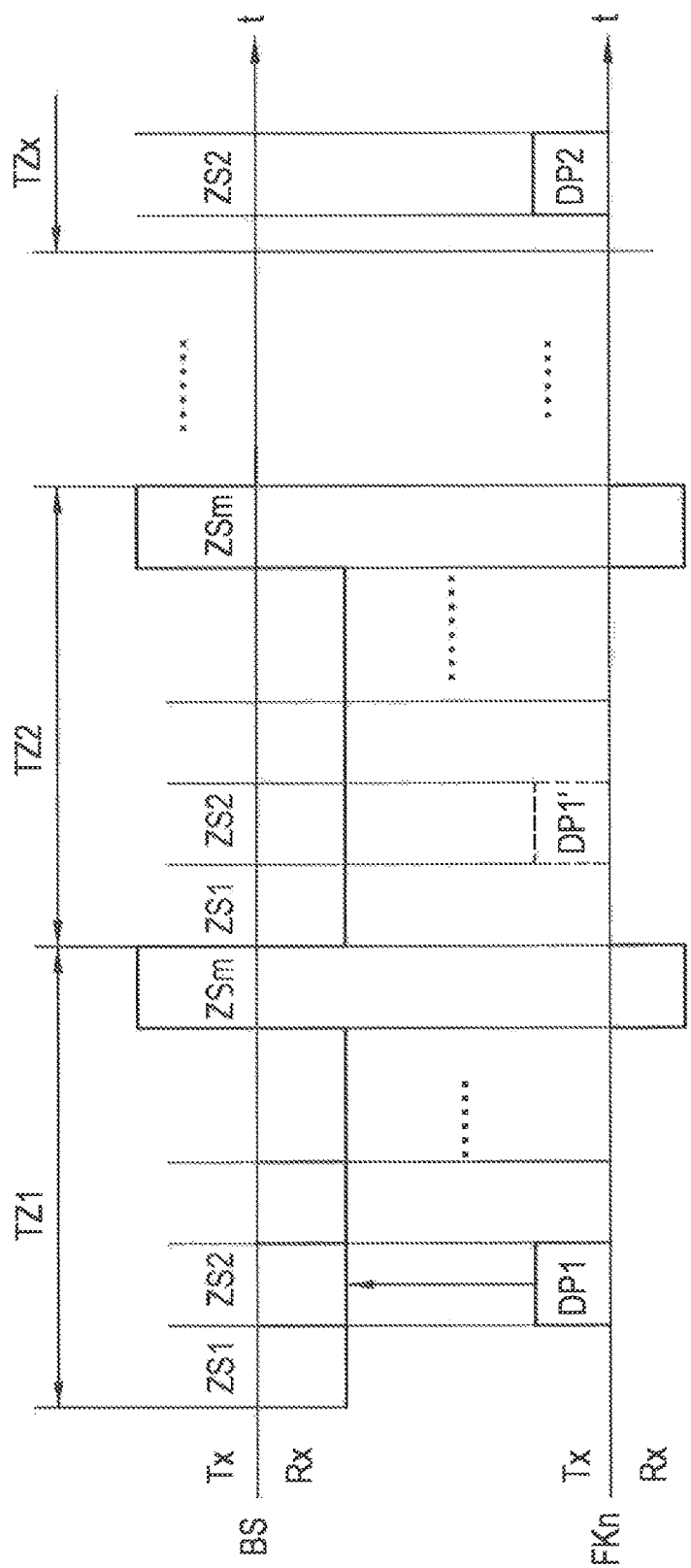
Figure 4:
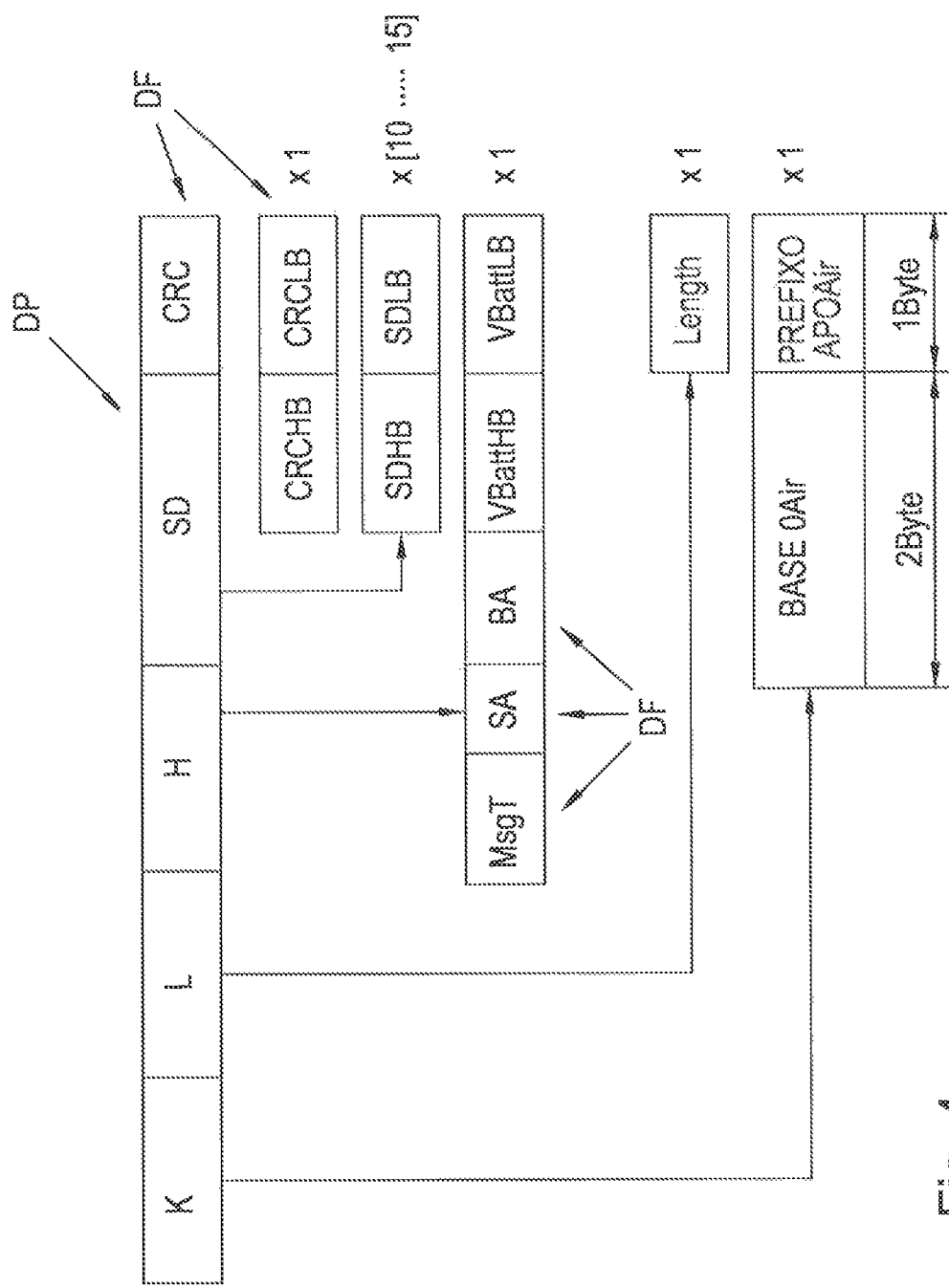
Figure 5:
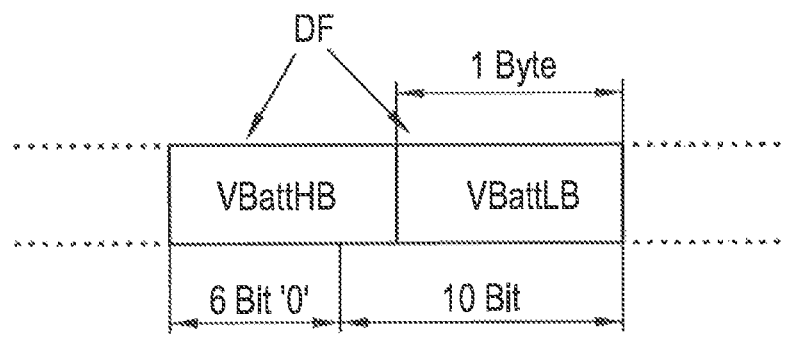
Figure 6:
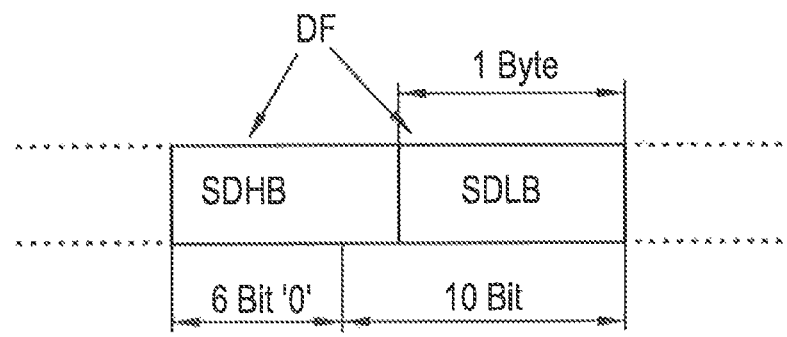
Figure 7:
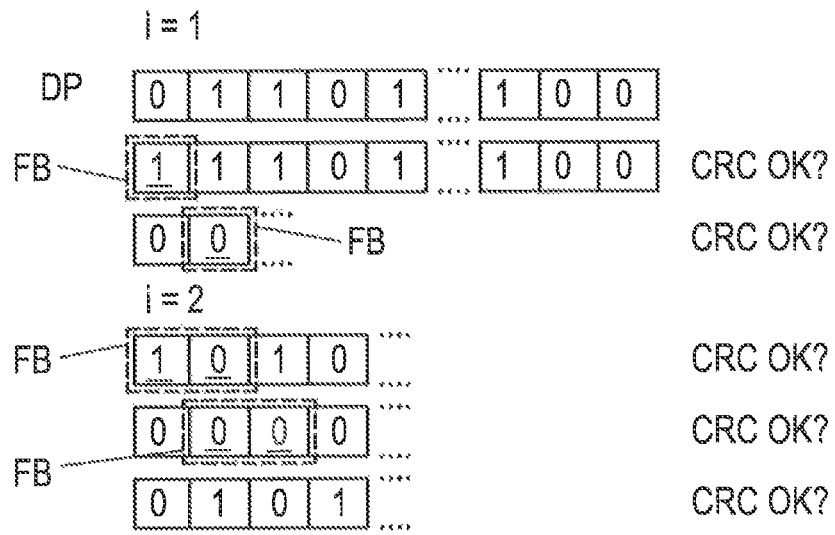
Figure 8:
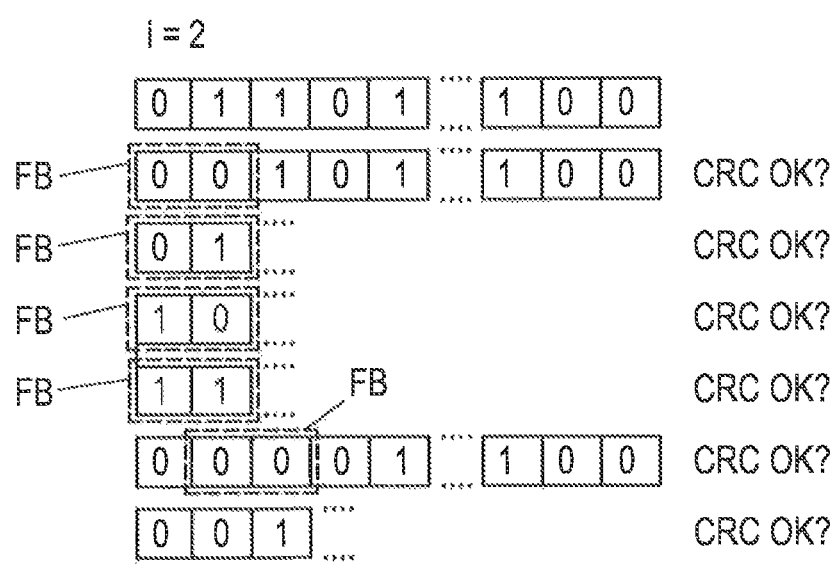
Figure 9:
Figure 10:

The present invention is explained in greater detail below with reference to FIGS. 1 through 11, which schematically show advantageous embodiments of the invention by way of example and in a nonlimiting manner, as follows:

FIG. 1 shows a typical configuration of a wireless sensor network,

FIG. 2 shows the data transmission after a synchronous time-division multiplex method, FIG. 3 shows a diagram of the retransmission of a data packet, FIG. 4 shows the structure of a data packet with various data fields, FIGS. 5 and 6 show examples of available a priori knowledge concerning the content of certain data fields, FIGS. 7 and 8 show an example of a method for reconstructing an incorrectly received data packet, FIGS. 9 and 10 show an example of a method for reconstructing an incorrectly received data packet, which requires a retransmission of the data packet, and FIG. 11 shows one possible method sequence in the method according to the invention for reconstructing an incorrectly received data packet.

FIG. 1 illustrates a typical configuration in a wireless sensor network 1 having a base station BS. A number of wireless nodes FK1 . . . FKn are wirelessly connected to the associated base station BS (indicated by dashed lines), and exchange data with the base station via a wireless data link. The base station BS is in turn connected to a control unit SE, to which multiple base stations BS, each having a number of associated wireless nodes FK, may also be connected. Of course, the base station BS and the control unit SE may also be integrated into one device. In the case of a sensor as a wireless node FK, the wireless node FK transmits data (generally measured values of a measured variable) in the form of data packets DP to the base station BS, and in the case of an actuator as a wireless node FK, the situation is correspondingly reversed, the data hereby typically including control instructions. For implementing a data transmission protocol, the base station BS may also transmit data packets DP to one or all wireless nodes FK, for example to request a retransmission of a certain data packet DP, for example if this data packet has been incorrectly received. However, it is noted that the specific data transmission protocol is not important for the present invention, and is therefore described only to the extent necessary for an understanding of the invention.

It is pointed out that the data packet DP contains information in various data fields DF. The data fields DF contain direct (i.e., uncoded) information. This information is transmitted in the form of data in data fields DF from the wireless node FK to the receiving unit 2. Heretofore, encoded information would be transmitted, for example, in customary error recognition and error correction mechanisms, which are not to be applied according to the invention.

Depending on the topology of the wireless sensor network 1, instead of a base station BS some other network user may be provided, such as a repeater (also a wireless node that functions as such) that is wirelessly connected to a number of wireless nodes FK. Therefore, general reference is made to a receiving unit 2 below.

For a wireless sensor network 1, it is advantageous when the data transmission is implemented according to a synchronous time division multiple access (TDMA) method, although the invention is not limited thereto. In the TDMA method, in a cyclically repeated transmission cycle TZ, m time slots ZSm are defined, within which an assigned wireless node FKn is permitted to transmit in each case. Thus, each wireless node FKn always transmits in the same time slot ZS in a transmission cycle TZ. To minimize the energy required for the data transmission, it may be provided that data are not transmitted in every transmission cycle TZ; rather, the data in the wireless node FKn are collected, and the collected data are transmitted in a data packet DP only in every xth transmission cycle TZ. This is schematically illustrated in FIG. 2. In transmission cycle TZ1, the wireless node FKn transmits in the associated time slot ZS2 a data packet DP1 to the receiving unit 2. The wireless node FKn once again transmits a data packet DP2 after x transmission cycles TZx. In each transmission cycle TZ, the receiving unit 2 sends a reply to the wireless nodes FK, in each case in the last time slot ZSm here, for example with an acknowledgment of receipt of a data packet DP1 and/or the request for retransmission of certain data packets DP. In the case of a retransmission, the wireless node FKn would not wait until the next transmission cycle TZx, and instead would resend the data packet DP1' in the very next following transmission cycle TZ2.

In one embodiment by way of example, the length of the transmission cycle TZ may be 100 ms, which is divided over m=10 time slots ZSm having a length of 10 ms. Thus, nine wireless nodes FKn (one time slot ZSm for the return channel) could be connected to a receiving unit. A wireless node FKn transmits every x=10th transmission cycle TZ. If the wireless node FKn as a sensor detects sensor data (a measured value, for example) every 100 ms, the wireless node can transmit ten sensor data SD items in a data packet DP every second to the receiving unit 2.

FIG. 3 illustrates by way of example a diagram for retransmission of a data packet DP. In the first transmission TA1, a data packet DP1 containing, for example, ten sensor data items SD1 . . . SD10 with a length of 2 bytes each is transmitted. In a retransmission TA2, the sensor data SD1 . . . SD10 are retransmitted in the data packet DP1' in the next transmission cycle TZ, whereby a new measured value detected in the meantime is appended as additional sensor data SD11. This may be repeated up to a certain maximum length of the data packet DP1. In the illustrated example, five retransmissions, each with new sensor data SD11 . . . SD15, are allowed (data packet DP1"). The oldest sensor data in each case are subsequently removed; for example, the sensor data item SD1 is removed from a new data packet DP1", which would result in a loss of data. To be able to distinguish between the retransmissions TA2 . . . TA8, different message types MsgT may also be defined in the data packet DP.

The structure of a data packet DP for implementing the invention is illustrated in FIG. 4 by way of example. The data packet DP contains various data fields DF, for example 3 bytes for identifying the logical channel K, which essentially defines the associated receiving unit, 1 byte having a length L of the data packet DP, 5 bytes with header data H, 10-15 occurrences of 2 bytes with sensor data SD, and 2 bytes with a check value CRC.

The header data H in turn include various data fields DF, in the present case a message type MsgT, a wireless node address SA in the wireless sensor network, a base address as a unique address of a receiving unit 2, and 2 bytes with the instantaneous state of charge VBatt of the supply battery of the wireless node FK. The 2 bytes of sensor data SD are each transmitted in a high byte SDHB and a low byte SDLB. The check value CRC is likewise divided into a high byte CRCHB and a low byte CRCLB, and the same applies to the state of charge VBatt. Of course, this data structure of a data packet DP is only an example, and may be arbitrarily selected.

The method according to the invention now makes use of the fact that the content of certain data fields DF is known in advance, for example due to the implemented data protocol or due to the knowledge of the transmitted data. The information in the data of these certain data fields DF is thus known; the information contained in the data may be directly evaluated in the receiving unit 2, since the data are transmitted uncoded from the wireless node FK. Therefore, certain bit values of data fields DF may be expected, as described below with reference to examples.

Data Field Length L:

The length of certain data fields DF in the data packet DP or also the total length of the data packet DP may be indicated as the length L, depending on the data transmission protocol. If, for example, the total length of a data packet DP according to FIG. 4 is between 31 bytes and 41 bytes (depending on the length of the sensor data SD), and overhead data such as the logical channel K, the length L, and the check value CRC are subtracted, for the length L the data field DF could indicate the length of the useful data, which in the present case comprise the message type MsgT, the wireless node address SA, the base address BA, and the instantaneous state of charge VBatt. The data field DF can thus assume only values in the range of 25 to 35 for the length L, i.e., L=[25, 35], or expressed as a binary value, L=[0001 1001, 0010 0011], where the value can increase by only 2, since the sensor data SD in each case comprise 2 bytes. Therefore, for the length L, the two highest bits in the data field DF must always be 0, and the lowest bit must always be 1.

Base Address BA:

The base address BA of the receiving units 2 in the wireless sensor network 1 are assigned in advance and are therefore known. If, for example, three receiving units 2 with the base address BA (hexadecimal) 0x01, 0x02, 0x03 are present, for the base address BA the five highest bits of the data field DF must always be 0.

Message Type MsgT:

The possible message types are fixed by the data transmission protocol that is implemented. In the example according to FIG. 3, for example only the following values are possible (hexadecimal): MsgT=(0x12, 0x13, . . . , 018). As a result, for the message type MsgT the four highest bits of the data field DF must always be 0.

State of Charge VBatt:

Based on the wireless node FKn used, the resolution with which the state of charge VBatt is transmitted is known. If, for example, the battery voltage in the wireless node is measured as the state of charge VBatt and digitized with a 10-bit analog-digital converter (ADC), the data field DF for the state of charge VBatt can occupy only the lowest ten bits, as the result of which the six highest bits must always be 0, as illustrated in FIG. 5.

Sensor Data SD:

Based on the wireless node FKn used, the resolution with which the measured values are detected is known. If, for example, a measured value in the wireless node is measured and digitized with a 10-bit ADC, a data field DF for sensor data SD can occupy only the lowest ten bits, as the result of which the six highest bits must always be 0, as illustrated in FIG. 6.

In a wireless sensor network 1, data packets DP are thus transmitted to a receiving unit 2 from a wireless node FK, whereby the data packet DP contains multiple data fields DF, and the value of at least one bit of the data field DF is known in advance, at least for one data field DF. When a data packet DP is received in the receiving unit 2 and it is established, for example based on the contained check value CRC, that the data field is corrupted, this information may be used for an attempt to reconstruct the data packet DP, without the need for a retransmission of the data packet DP. For this purpose, a data field DF of the data packet DP may be examined in the receiving unit 2, using an expected known bit value, and checked for whether the expected value (0 or 1) is contained at the expected bit position. If this is not the case, the value of this bit may be modified, and based on the check value CRC, checked for whether the received data packet DP could thus be reconstructed. This may be repeated for all bits of the data packet DP that must have a certain known value. By use of this procedure, it is often possible to reconstruct data packets DP without the need for a retransmission of the data packet DP. This method is also referred to below as an a priori method, since knowledge that is known in advance is used.

In addition, information that could be used for the reconstruction may also be derived from the data packet DP itself. The derivable information concerning certain bits of the data packet DP is also regarded as known information. Thus, other information is thus derived from the known information contained in the data, and therefore is also known information; the information contained in the data may be directly evaluated in the receiving unit 2, since the data are transmitted uncoded from the wireless node FK. As a result, for certain data fields DF a certain content, i.e., certain bit values, is/are expected, as described below with reference to examples.

Message Type MsgT:

The message type MsgT may be derived from the number of sensor data SD items contained in the data packet DP. As illustrated in FIG. 3, each retransmission of a data packet DP receives its own message type MsgT. Since the length of the sensor data SD (in 2-byte steps) also simultaneously increases with each retransmission, an expected message type MsgT may be derived from the number sensor data SD items. If 2 bytes of sensor data SD are received 11 times, for example, a message type MsgT 0x13 is expected (FIG. 3).

Sensor Address SA:

When the TDMA transmission method is used (see FIG. 2), an expected sensor address AS may be derived from the time slot ZS in which the data packet DP has been received, since each wireless node FK (having an assigned sensor address SA) is associated with a time slot ZS. If the wireless node FK1 having the sensor address SA 0x01 is associated with the time slot ZS1, it is assumed that each data packet DP received during this time slot ZS1 originates from this wireless node FK1, and that the sensor address SA contained in these data packets DP must therefore be 0x01.

Therefore, once again the procedure may be followed that in the event of a corrupted received data packet DP, the value of at least one data field DF of the data packet DP is modified based on knowledge that is present in advance, and a check is made for whether such a modification reconstructs the data packet DP. This method is also referred to below as an a posteriori method, since knowledge is derived from a received data packet DP.

Besides the use of known or derivable knowledge concerning the data packet DP, other mechanisms may also be utilized for attempting to reconstruct an incorrectly received data packet DP.

In a first such method (also referred to as the consecutive bits method), which is described with reference to FIG. 7, an error block FB having a length of i bits is specified. The error block FB is shifted by an increment of 1 bit over the entire data packet DP or over a portion of the data packet DP (header H+sensor data SD, for example), each bit in the error block FB is inverted, and the check value CRC is checked in each step. The length i may also be increased in multiple iterations. This method assumes that burst-like disturbances occur, and that multiple adjacent bits are always disturbed.

In the example according to FIG. 7, an error block FB having a length i=1 is initially shifted over a data packet DP, and the particular bit in the error block FB is inverted with respect to the corresponding bit in the received data packet DP (0→1, 1→0) (bits outlined by dashed lines). The check value CRC is checked in each step, and the checking is terminated if a correct check value CRC results. If not, the length i of the error block FB is increased by 1, the error block FB is once again shifted over the data packet DP, and all bits in the error block FB are once again inverted (bits outlined by dashed lines). This may be repeated up to a certain predefined length i.

FIG. 8 illustrates an expansion of the method according to FIG. 7. The bits in an error block FB are not simply inverted, but, rather, are reiterated in the error block, so that all possible bit assignments are checked.

An attempt to reconstruct data may thus also be carried out without the need for a retransmission of a data packet DP. If an incorrect data packet DP cannot be reconstructed using these methods, other known methods, such as combinatorial testing as described below with reference to FIG. 9, may be applied.

In the example according to FIG. 9, a data packet DP1 has been received, and via the check value CRC it has been determined that the data packet DP1 is incorrect. The data packet DP1 is then stored, and a retransmission of the data packet DP1 is requested. The retransmitted data packet DP1' is rechecked based on the check value CRC. If the data packet DP1' is satisfactory, it is accepted and no reconstruction attempts are necessary. However, if the retransmitted data packet DP1' is also incorrect, combinatorial testing is applied. However, it must kept in mind that the retransmitted data packet DP1' may possibly contain additional sensor data SD11 (compare to FIG. 3), as indicated in FIG. 9, which for the combinatorial testing should expediently be excluded. In combinatorial testing, the bit positions at which the data packets DP1, DP1' differ (outlined by dashed lines in FIG. 9) are initially determined. These bit positions are now reiterated by trying all possible bit value assignments, and in each case computing the check value CRC. If the check value CRC matches, the modified data packet DP1 is relayed as a correct data packet. If a successful reconstruction of the data packet DP1 is not possible, the second data packet DP1' is also stored, and a new retransmission may be requested. The combinatorial testing may then be applied to all stored data packets DP1, DP1', DP1" or to any given pair of the stored data packets DP1, DP1', DP1" when the retransmitted data packet DP1" arrives.

FIG. 10 illustrates yet another possible adaptation of the combinatorial testing according to FIG. 9. Here, i bits are added before and after the differing bit positions (outlined by dashed lines), where i=1 in FIG. 10, and all possible bit assignments in these bit ranges BB are reiterated. Of course, different variations are conceivable, for example expansion only before or only after the differing bit positions, or different numbers of bits before and after the differing bit positions.

In another adaptation of the combinatorial testing, it could also be provided not to modify all differing bit positions immediately, but, rather, to select specific bit positions according to certain criteria and to modify these first. For example, the data field DF could be used for the state of charge VBatt, so that in the event of a low state of charge VBatt the end of the data packet DP is examined first, since with a low state of charge VBatt it may be assumed that the transmission power of the wireless node FK will break down due to a virtually empty energy store. It would also be conceivable to use prior reconstruction attempts as a criterion, and to first examine the bits for which errors were detected in earlier reconstructions.

Any known method (cyclic redundancy check, for example) may of course be used for determining the check value CRC, for use in a wireless sensor network it being naturally advantageous when the computation effort for the check value CRC is low. However, the schematic pattern is always the same. A check value CRC is computed from certain data fields DF of the data packet DP and appended to the data packet. The receiver then likewise computes the check value CRC, according to the same method and from the same data fields of the received data packet DP, and compares the computed value and the transmitted check value CRC. When these values are the same, it is assumed that the transmitted data are correct, and when these values are not the same, it is assumed that the data have been incorrectly transmitted.

A method for reconstructing an incorrectly received data packet in a wireless sensor network 1 may thus proceed as described with reference to FIG. 11 as an example. In order to optimally meet the particular requirements in a wireless sensor network 1, a suitable consecutive sequence of methods for reconstruction is applied. Since a retransmission in the next transmission cycle TZ has to be requested, following a faulty reception of a data packet DP the reconstruction of the data packet DP must be successful within a predefined time period, or the retransmission is requested. It is practical to begin with the method that promises the highest probability of success with the lowest possible computation effort. This is followed by the method with the next best method probability of success and/or next best computation effort. The probability of success is understood to mean the probability that a method for reconstruction can be carried out within the available time.

A data packet DP transmitted from a wireless node FKn is received in a receiving unit 2 in step S1, and the check value CRC is checked. If the check value CRC matches, the data packet DP (or a portion thereof) is relayed to a higher-order application level, in the present case to the control unit SE, for example. If the check value CRC does not match the content of the data packet DP, the first method (a priori method) for reconstructing the data packet DP is applied in step S2, in which the content of data fields DF, known in advance, is checked. With this method, certain bits of the data packet DP may be checked in a targeted manner with little computation effort, which thus provides a high probability of success. If this does not result in reconstruction of the data packet DP, if sufficient time remains the second method (a posteriori method) may be applied in step S3, in which information concerning data fields DF is derived directly from the content of the data packet DP. This method requires slightly more computation effort, since certain data fields DF must initially be evaluated. Since the a priori method and the a posteriori method are similar, these could also be carried out in one step. If this also does not result in success, if sufficient time remains the third method (consecutive bits) may be applied in step S4. Due to the fact that many bit combinations must be checked here, and the check value CRC must be computed in each case, this method requires a correspondingly large amount of computation effort. If this is also not successful and if sufficient time does not remain, the received data packet DP is stored in a data packet buffer 3 in step S5. If data packets DP' previously incorrectly received from the wireless node FKn are already contained in the data packet buffer 3 (query S6), a known combinatorial testing method may be applied in step S7. If no previously received data packets DP' are contained in the data packet buffer 3, or if the combinatorial testing method also does not result in success, a retransmission of the data packet DP is initiated in step S8. The retransmitted data packet DP is awaited in step S9, whereupon the operation is repeated after receipt of this data packet DP.

Different variations are of course conceivable here. For example, the consecutive bits method could be used instead of the a posteriori as the second method, or the sequence of the second, third, and further methods could be changed, it being advantageous to order the methods to be applied in accordance with the computation effort.

The invention claimed is:

1. A method for reconstructing an incorrectly received data packet that has been transmitted in a wireless sensor network from a wireless node to a receiving unit, wherein
   a first method and a second method for reconstructing the incorrectly received data packet are implemented in the receiving unit, the first method requiring less computational effort than the second method,
   in a first step, the first method for reconstructing the incorrectly received data packet is applied and a check is made for whether the incorrectly received data packet has thus been reconstructed, and
   in a subsequent second step, the second method for reconstructing the incorrectly received data packet is applied if the incorrectly received data packet has not been reconstructed with the first method, and a check is made for whether the incorrectly received data packet has thus been reconstructed.

2. The method according to claim 1, wherein at least one further subsequent step, a further method, implemented in the receiving unit, for reconstructing the incorrectly received data packet is applied if the incorrectly received data packet has not been reconstructed with the second method, and a check is made for whether the incorrectly received data packet has thus been reconstructed.

3. The method according to claim 1, wherein in the first method, the value of at least one bit of a data field of the incorrectly received data packet is known, and in the incorrectly received data packet this at least one bit is modified, and a check is made for whether the incorrectly received data packet has been reconstructed due to this modification.

4. The method according to claim 1, wherein in the second method, the expected value of at least one bit of a data field is derived from the incorrectly received data packet, and this at least one bit in the incorrectly received data packet is modified, and a check is made for whether the incorrectly received data packet has been reconstructed due to this modification.

5. The method according to claim 1, wherein in the second method or in the further method, an error block having a length of bits is shifted step by step over at least a portion of the incorrectly received data packet, and in each step all bits present in the error block are inverted, and in each step a check is made for whether the incorrectly received data packet has been reconstructed due to this modification.

6. The method according to claim 5, wherein in each step the bits present in the error block are reiterated, and in each case a check is made for whether the incorrectly received data packet has been reconstructed due to this modification.

7. The method according to claim 1, wherein in the second method or in the further method, at least two incorrectly received data packets are compared to one another, and bit positions are identified at which the at least two incorrectly received data packets differ, and the bits are reiterated step by step at at least one of these bit positions, and in each step a check is made for whether the incorrectly received data packet has been reconstructed due to this modification.

8. The method according to claim 7, wherein a bit range is defined around the bit position, with a number of bits before the bit position and/or a number of bits after the bit position, and the bits in the bit range are reiterated step by step, and in each step a check is made for whether the incorrectly received data packet has been reconstructed due to this modification.

9. The method according to claim 1, wherein the first and second methods are performed before an end of a time period for requesting retransmission of the incorrectly received data packet.

10. The method according to claim 1, wherein the second method is performed if sufficient time remains to complete the second method before an end of a time period for requesting retransmission of the incorrectly received data packet.

11. The method according to claim 2, wherein the further method is performed if sufficient time remains to complete the further method before an end of a time period for requesting retransmission of the incorrectly received data packet.

12. The method according to claim 1, wherein the first method uses a priori knowledge of the incorrectly received data packet and the second method uses a posteriori knowledge derived from the incorrectly received data packet.

13. A system for reconstructing an incorrectly received data packet that has been transmitted from a wireless node in a wireless sensor network, comprising:
    a receiving unit receiving the incorrectly received data packet from the wireless node;
    the receiving unit having a processor configured to perform:
        a first method for reconstructing the incorrectly received data packet;
        a first check whether the incorrectly received data packet has been reconstructed using the first method;
        if the incorrectly received data packet has not been reconstructed with the first method, a second method for reconstructing the incorrectly received data packet;
    wherein the first method requires less computational effort than the second method.

14. The system according to claim 13, wherein the first and second methods are performed before an end of a time period for requesting retransmission of the incorrectly received data packet.

15. The system according to claim 14, wherein the first method uses a priori knowledge of the incorrectly received data packet and the second method uses a posteriori knowledge derived from the incorrectly received data packet.

16. The system according to claim 13, wherein the processor of the receiving unit is configured to perform:
    a second check whether the incorrectly received data packet has been reconstructed using the second method;
    if the incorrectly received data packet has not been reconstructed with the second method, a third method for reconstructing the incorrectly received data packet.

17. The system according to claim 16, wherein the first, second, and third methods are performed before an end of a time period for requesting retransmission of the incorrectly received data packet.

18. The system according to claim 17, wherein the second method requires less computational effort than the third method.

* * * * *